(12) United States Patent
Yasuzato

(10) Patent No.: US 7,923,179 B2
(45) Date of Patent: Apr. 12, 2011

(54) EXPOSURE MASK AND PATTERN FORMING METHOD THEREFOR

(75) Inventor: Tadao Yasuzato, Tokyo (JP)

(73) Assignee: Elpida Memory Inc., Tokyo (JP)

( * ) Notice: Subject to any disclaimer, the term of this patent is extended or adjusted under 35 U.S.C. 154(b) by 148 days.

(21) Appl. No.: 12/366,219

(22) Filed: Feb. 5, 2009

(65) Prior Publication Data
US 2009/0202926 A1    Aug. 13, 2009

(30) Foreign Application Priority Data
Feb. 8, 2008   (JP) ................... 2008-028381

(51) Int. Cl.
  *G03F 1/00*   (2006.01)
  *G03F 7/00*   (2006.01)
(52) U.S. Cl. ............................ 430/5; 430/311
(58) Field of Classification Search ...... 430/5, 311–313, 430/322–324
See application file for complete search history.

(56) References Cited

U.S. PATENT DOCUMENTS

| | | | | |
|---|---|---|---|---|
| 5,840,447 A | * | 11/1998 | Peng | 430/5 |
| 6,048,647 A | * | 4/2000 | Miyazaki et al. | 430/5 |
| 6,887,633 B2 | * | 5/2005 | Tang | 430/30 |
| 7,354,682 B1 | * | 4/2008 | Capodieci | 430/5 |
| 2003/0180629 A1 | * | 9/2003 | Wu | 430/5 |
| 2004/0010385 A1 | * | 1/2004 | Fukuhara et al. | 702/83 |
| 2006/0088770 A1 | * | 4/2006 | Tan et al. | 430/5 |

FOREIGN PATENT DOCUMENTS

JP   2003-241361   8/2003

* cited by examiner

*Primary Examiner* — S. Rosasco
*Assistant Examiner* — Stewart A Fraser
(74) *Attorney, Agent, or Firm* — Young & Thompson

(57) ABSTRACT

An exposure mask is constituted of hole-patterns whose scales are higher than the limit resolution of exposure light and which are repetitively aligned in X-Y directions with the prescribed pitch (ranging from 140 nm to 180 nm) therebetween, halftone phase shift regions whose transmission factors range from 2% to 20% and each of which is aligned between two hole-patterns adjacently lying in the X-direction or the Y-direction so as to apply an inverse phase to incidence light, and light preventive regions each of which is aligned between two hole-patterns adjacently lying in an oblique direction inclined to the X-direction or Y-direction by 45°. The exposure mask is illuminated with azimuthal polarization light which is produced by a secondary light source of a zonal illumination and whose polarization direction is perpendicular to the radial direction of the secondary light source.

14 Claims, 5 Drawing Sheets

TRANSMISSION FACTOR (%) OF PERIPHERAL REGION 12a

EXPOSURE MASK AND PATTERN FORMING METHOD THEREFOR

BACKGROUND OF THE INVENTION

1. Field of the Invention

The present invention relates to exposure masks, and in particular to pattern forming methods for forming patterns corresponding to exposure masks on semiconductor wafers.

The present application claims priority on Japanese Patent Application No. 2008-28381, the content of which is incorporated herein by reference in its entirety.

2. Description of Related Art

Recent optical lithography allows exposure devices to use exposure light having short wavelengths ($\lambda$), large numerical apertures (NA) in projection lenses, and fine patterns whose resolutions are less than one-half the wavelengths of exposure light by way of a high resolution method. In general, the resolving power R of the optical lithography is defined as $R=k1 \cdot \lambda/NA$, while the numerical aperture NA is defined as $NA=n \cdot \sin \theta$, where $\theta$ denotes a maximum incidence angle on an imaging plane, specifically, it represents the size of a projection lens for collecting light diffracted by a mask, and n denotes a refraction rate of a medium positioned between the projection lens and the wafer. Exposure devices are developed to increase the value of $\sin \theta$ up to "1" and to increase NA to be greater than "1" (i.e. NA>1) by way of an immersion exposure technology for filling liquid in the space between the projection lens and the wafer. In the above, k1 denotes a coefficient dependent upon the process of resist materials, wherein it may gradually decrease due to improvements of resist materials and due to improvements of focusing precisions of exposure devices. As a result, it is possible to achieve fine resolutions due to improvements of the resolving power in the optical lithography technology.

The high resolution method is used to improve resolutions by optimizing the optical shape of an illumination source adapted to a mask, the distribution of light transmitted via the mask, or the amplitude distribution on a pupil plane. The mask is an exposure disk having a circuit pattern (referred to as a mask pattern) installed in the exposure device, wherein it may be frequently referred to as a reticle when the reduction factor thereof is less than "1". For the sake of convenience, any type of exposure patterns adapted to exposure devices will be referred to as masks. For example, a mask pattern is formed by etching an optical-preserve film composed of chromium formed on a transparent substrate composed of quartz.

An oblique incidence illumination is known as the high resolution method for optimizing the optical shape of an illumination source, wherein "perpendicular" incidence light perpendicularly incident on a fine mask may not contribute to resolutions and is thus prevented so as to use only the oblique incidence light for illuminating the mask. The conventionally-known illumination may need to collect zero-degree plus/minus one-degree components of refraction light when resolving repetitive patterns. In contrast, the oblique illumination discards one of plus/minus one-degree components added to the zero-degree component of refraction light so as to image repetitive patterns with original pitches by way of double luminous interference using the zero-degree component and the other of plus/minus one-degree components in the refraction light.

Discarding one of plus/minus one-degree component added to the zero-degree component of the refraction light degrades the optical balance in the zero-degree component of the refraction light so as to degrade the best-focus contrast in the oblique illumination. However, the oblique illumination has one-half the incidence angle at the imaging plane compared to the conventionally-known illumination; hence, it may reduce the degradation of the defocus contrast, thus increasing a focal depth. The focal depth indicates a focal range for producing an effective resist pattern.

Due to the progression in the high numerical aperture (NA) of the exposure device, polarization has become popular instead of an illumination source for controlling optical shapes. It is known that the amplitude direction of an electric field greatly affects the magnitude of optical interference as the incidence angle of the zero-degree and first-degree components of light incident on the wafer become large. It is possible to provide another method which controls polarization of an illumination source so as to improve resolution characteristics. It is possible to improve resolution characteristics by using azimuthal polarization light. Azimuthal polarization light is caused by linear polarization whose polarization direction matches the tangential line of a concentric circle of a second-order illumination source forming a zonal illumination. In addition, it is possible to provide other methods which improve resolution characteristics by adapting a Y-polarizer to X-dipole illumination and by adapting an X-polarizer to Y-dipole illumination.

It is possible for the high resolution method to use the well-known phase shift mask, which is related to the Shibuya-Lebenson method and the halftone method. A Shibuya-Lebenson phase shift mask (referred to as a Lebenson phase shift mask) causes a 180-degree phase inversion to alternately occur between the phases of light transmitted via adjacent openings of a mask, thus forming a clear shadow due to the interference of light having inverted phases.

A halftone phase shift mask slightly leaks light in a light preventive region of a mask so that the phase of the leaked light is subjected to a 180-degree inversion compared to the phase of light transmitted via an opening of the mask. The halftone phase shift mask is frequently used because it can be easily adapted to the exposure device. In general, light preventive films of masks are composed of chrome metals, whereas halftone phase masks use semitransparent films (or halftone films) composed of metal oxides, nitride oxides (MoSiON), and metal fluorides (CrF) instead of light preventive films.

It is known that the maximum focal depth can be achieved via hole-patterns forming openings in a mask in accordance with Bessel functions in the amplitude distribution of light transmitted through the mask. Using negative amplitudes of light transmitted through the semitransparent film makes the amplitude distribution of the transmitted light of the mask approximate to Bessel functions so as to increase the focal depth. Patent Document 1 teaches an example of a halftone phase shift mask having multiple hole-patterns forming openings in a halftone film.

Patent Document 1: Japanese Unexamined Patent Application Publication No. 2003-241361

In the case of line-and-space patterns which are one-dimensional patterns aligned one-dimensionally, it is possible to achieve almost-perfect imaging of double luminous interference by way of exposure using the Lebenson phase shift mask in the prescribed luminance condition defining a small coherent factor ($\sigma$) or using the halftone phase shift mask and the dipole illumination. Herein, $\sigma$ denotes a scale factor of an illumination lens compared to the pupil plane of a light source, wherein $\sigma$ is expressed by a division of "NA of illumination lens"/"NA of projection lens".

The present inventor has recognized that even when exposure is performed using the above mask and illumination, it is very difficult to achieve perfect imaging of double luminous interference in hole-patterns and dot-patterns, which are two-dimensional patterns aligned two-dimensionally. In addition, the above technology suffers from problems that perfect imaging of double luminous interference cannot be achieved in two-dimensional patterns such as hole-patterns and dot-patterns which are two-dimensionally aligned patterns, the resolving power decreases in two-dimensional patterns, and pitches cannot be reduced. Even when exposure is performed using the oblique incidence illumination and the Lebenson phase shift mask, the resolving power should be decreased in two-dimensional patterns compared to one-dimensional patterns. As a result, fine fabrication cannot be achieved in specific processes in manufacturing devices (e.g. exposure processes). The above problems prevent the overall layout areas of chips from being further reduced in semiconductor manufacturing processes.

SUMMARY

The invention seeks to solve the above problems or to improve upon the problems at least in part.

In one embodiment, an exposure mask is constituted of a plurality of rectangular patterns whose scales are higher than a limit resolution of exposure light and which are repetitively aligned in a first direction and a second direction, which are perpendicular to each other; a plurality of semitransparent regions, each of which is aligned between two rectangular patterns adjacently lying in either the first direction or the second direction so as to apply an inverse phase to incident light; and a plurality of light preventive regions, each of which is aligned between two rectangular patterns adjacently lying in a third direction which differs from the first direction and the second direction.

In another embodiment, an exposure mask is constituted of a plurality of rectangular patterns whose scales are higher than a limit resolution of exposure light and which are repetitively aligned in a first direction and a second direction, which are perpendicular to each other, wherein the rectangular patterns are composed of semitransparent regions for applying an inverse phase to incidence light; a plurality of light preventive regions, each of which is aligned between two rectangular patterns adjacently lying in either the first direction or the second direction; and a plurality of transparent regions, each of which is aligned between two rectangular patterns adjacently lying in a third direction which differs from the first direction and the second direction.

In a further embodiment, an exposure mask is constituted of a plurality of rectangular patterns composed of transparent regions whose scales are higher than a limit resolution of exposure light and which are repetitively aligned in a first direction and a second direction which are perpendicular to each other; a plurality of semitransparent regions, each of which is aligned between two rectangular patterns adjacently lying in either the first direction or the second direction so as to apply an inverse phase to incidence light; and a plurality of phase shift regions, each of which is aligned between two rectangular patterns adjacently lying in a third direction which differs from the first direction and the second direction so as to apply an inverse phase to the incidence light.

The present invention is also directed to a pattern forming method for forming a pattern on a wafer by use of the above exposure mask, which is illuminated with linear polarization light by an oblique incident illumination.

As described above, the overall peripheral area of the rectangular pattern is divided into a region lying in the first or second direction and another region lying in the third direction, for which a determination is made whether to apply an inverse phase to the incidence light by controlling the transmission factor thereof. This approximately establishes Bessel function with regard to the amplitude distribution of light transmitted through the exposure mask relative to the distances from the center of each rectangular pattern in the first, second, and third directions. Thus, it is possible to improve the optical intensity distribution regarding two-dimensional patterns; hence, it is possible to form resist patterns of high quality by use of the above exposure masks.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF PREFERRED EMBODIMENTS

The present invention will be now described herein with reference to illustrative embodiments. Those skilled in the art will recognize that many alternative embodiments can be accomplished using the teachings of the present invention and that the invention is not limited to the embodiments illustrated for explanatory purposes.

1. First Embodiment

Figure 1:
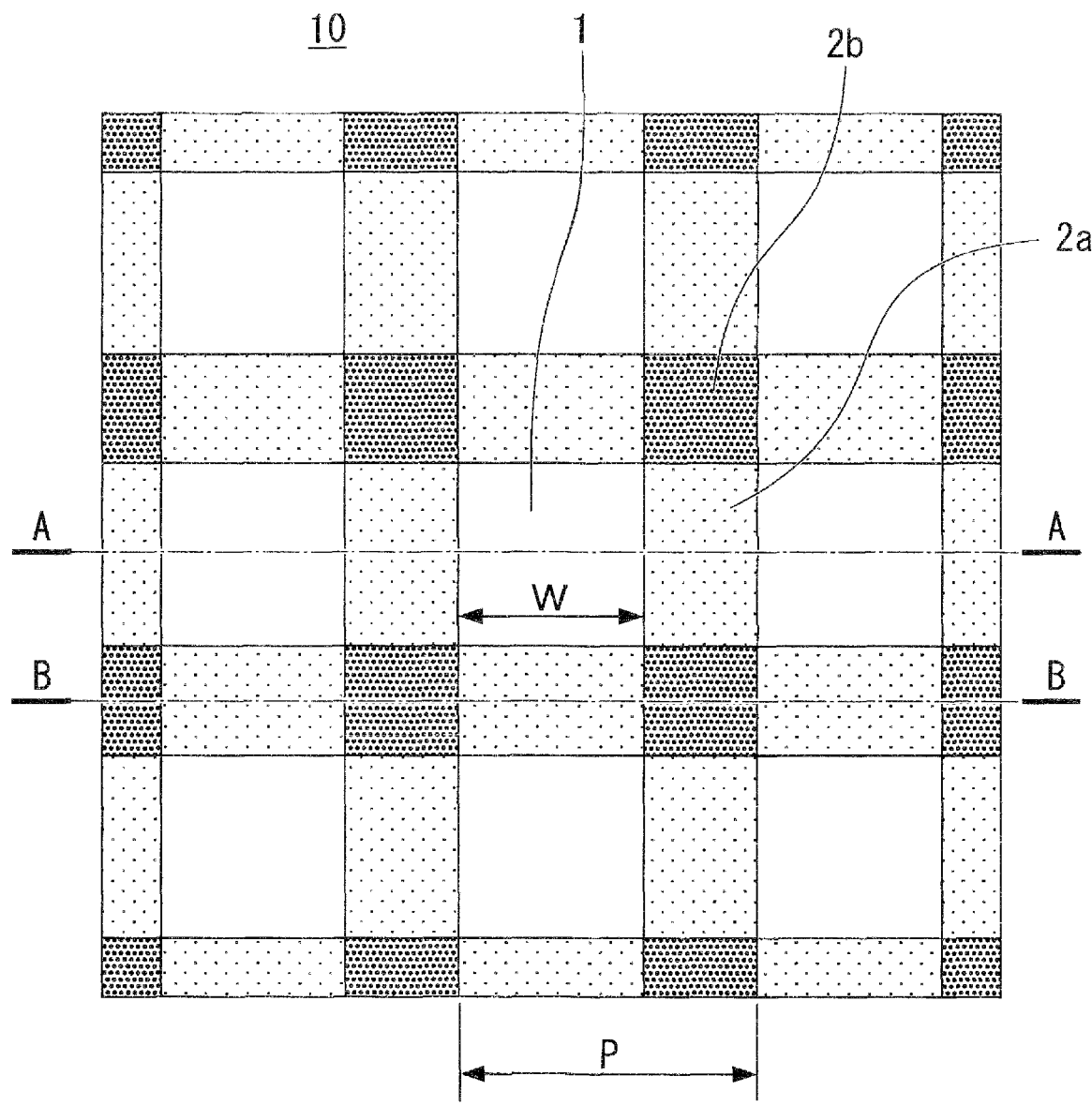
FIG. 1 is a plan view showing an exposure mask in accordance with a first embodiment of the present invention.

FIG. 1 is a plan view showing an exposure mask in accordance with a first embodiment of the present invention. Specifically, the first embodiment is described with respect to an exposure mask (simply referred to as a mask) 10 which is used to form a prescribed pattern on a wafer (not shown) in an exposure process. The mask 10 includes rectangular patterns (or hole-patterns) 1 and peripheral regions 2a and 2b. For the sake of convenience, the mask 10 is illustrated using prescribed dimensions transferred onto the wafer. In actuality, the mask 10 is enlarged in dimensions by reduction factors applied to an exposure device in an exposure process.

The hole-pattern 1 has a square shape whose scale (where W=80 nm) is greater than the limit resolution of exposure light, for example, wherein it is formed using transparent regions which are aligned with a certain pitch P therebetween in the X-direction and Y-direction. In the present embodiment, the pitch P is set to a minimum pitch of 140 nm. The peripheral region 2a has a rectangular shape (in which the long side is 80 nm, and the short side is 60 nm) and is positioned between two adjacent hole-patterns 1 lying in the X-direction and in the Y-direction. The peripheral region 2a is constituted of a halftone phase shift region (whose transmission factor is 6%) for applying an inverse phase to incidence light. The peripheral region 2b has a square shape (each side of which is 60 nm) and is constituted of a light preventive region (whose transmission factor is 0%) which is positioned between two adjacent hole-patterns 1 lying obliquely to the X-direction and Y-direction, i.e. lying in 45-degree and 135-degree oblique directions, with the above pitch multiplied by the square root of two therebetween.

Figure 2A:
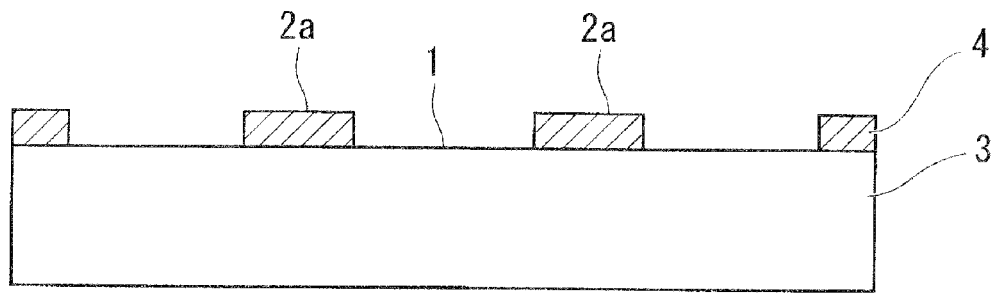
FIG. 2A is a cross-sectional view taken along line A-A in FIG. 1.
Figure 2B:
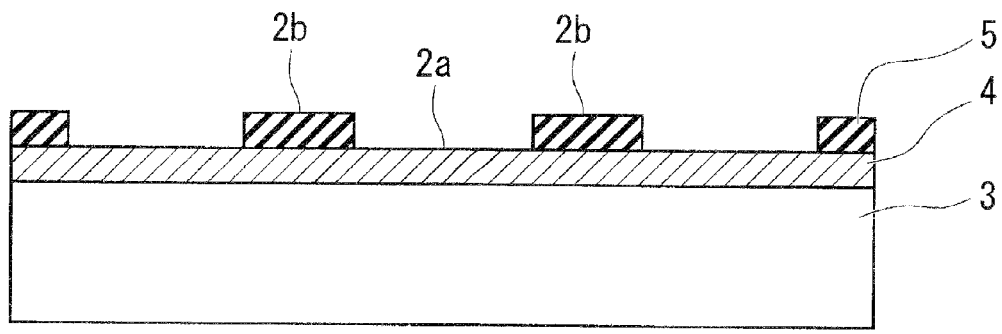
FIG. 2B is a cross-sectional view taken along line B-B in FIG. 1.

FIG. 2A is a cross-sectional view taken along line A-A in FIG. 1, and FIG. 2B is a cross-sectional view taken along line B-B in FIG. 1. A mask substrate prepared for the manufacturing process of the mask 10 is formed by sequentially forming a halftone film 4 composed of molybdenum silicide nitride oxide (MoSiON) and a light preventive film 5 composed of chromium (Cr) and chromium oxide (CrxOy) on a transparent substrate 3 composed of synthetic quartz ($SiO_2$). A positive resist is applied to the mask substrate so as to perform mask printing, thus forming the mask 10 shown in FIG. 1. The mask 10 includes the hole-patterns 1 constituted of the transparent substrate 3, the peripheral regions 2a constituted of the halftone film 4 formed on the transparent substrate 3, and the peripheral regions 2b constituted of the halftone film 4 and the light preventive film 5 formed on the transparent substrate 3.

Figure 3:
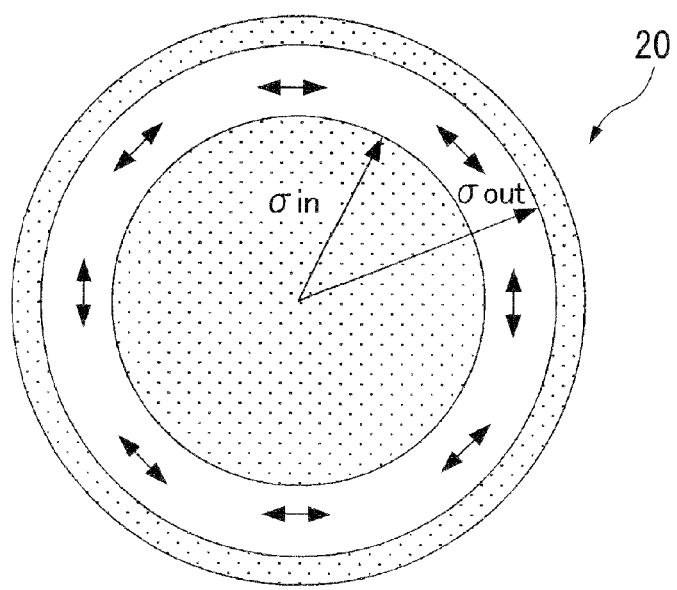
FIG. 3 is a plan view showing a zonal illumination for illuminating the exposure mask with linear polarization light.

Next, a pattern forming method for forming patterns on a wafer by way of exposure using the mask 10 will be described in such a way that an ArF exposure device (where "exposure wavelength $\lambda$"=193 nm, and NA=0.92) is used to illuminate the mask 10 with a zonal illumination 20 shown in FIG. 3. The zonal illumination 20 whose light preventive factor is 75% is used in the prescribed optical condition where $\sigma$out=0.95, $\sigma$in=0.7125. Specifically, the zonal illumination 20 illuminates the mask 10 with azimuthal polarization light, wherein the mask 10 is also illuminated with non-polarization light. Azimuthal polarization light is a linear polarization light whose polarization direction is shown by arrows in FIG. 3, wherein the polarization direction thereof is perpendicular to the radial direction of a secondary light source of the zonal illumination 20.

TABLE 1

| | Pitch | | | | | | | |
|---|---|---|---|---|---|---|---|---|
| | 140 nm | | 160 nm | | 180 nm | | 200 nm | |
| Polarization | N | Y | N | Y | N | Y | N | Y |
| Embodiment | 0.661 | 1.005 | 1.082 | 1.311 | 1.311 | 1.389 | 1.187 | 1.16 |
| Comparison 1 (0%) | 0.448 | 0.6757 | 0.834 | 1.101 | 1.113 | 1.297 | 1.142 | 1.223 |
| Comparison 2 (6%) | 0.652 | 0.992 | 1.066 | 1.095 | 1.21 | 0.993 | 0.997 | 0.649 |

Table 1 shows resolution characteristics of resist patterns by use of NILS (Normalized Image Log-Slope) values of hole-patterns 1 in accordance with the pattern formation method using the mask 10. Generally speaking, resist reaction proportionally depends upon the logarithmic value of optical intensity; hence, the slope (or incline) of the logarithmic value of optical intensity is used as a parameter for assessing resolutions of resist patterns, i.e. ILS (Image Log Slope) values. In the following description, resolution characteristics are indicated using NILS values (i.e. normalized ILS values) so as to assess resolutions of resist patterns having different scales on the prescribed assessment basis. Resist patterns having NILS values of about 1.0 can be formed on wafers with high quality. NILS values are normalized by multiplying the slopes of logarithmic values of optical intensities by the scales thereof.

Table 1 shows NILS values of the hole-patterns 1 whose pitches in the X-direction and Y-direction range from 140 nm to 200 nm in the mask 10 according to the present embodiment, NILS values of a chromium light preventive mask whose transmission factor is 0% as "comparison 1", and NILS values of a conventionally-known halftone mask whose transmission factor is 6% as "comparison 2". Using the mask 10 of the present embodiment and the masks of comparison 1 and comparison 2, the zonal illumination 20 is used to irradiate azimuthal polarization light or non-polarization light onto the wafer so as to measure NILS values.

In comparison 2 compared to comparison 1, it is possible to improve NILS values by illuminating the halftone mask having the small pitch of 140 nm with azimuthal polarization light. As the pitch becomes large, NILS values extremely decrease in comparison 2 using the halftone mask illuminated with azimuthal polarization light, whereas they are improved in comparison 1 using the chromium light preventive mask.

The mask 10 of the present embodiment uses the halftone phase shift region (whose transmission factor ranges from 2% to 20% and is actually set to 6%) as each of the peripheral regions 2a lying about the hole-pattern 1 in the X-direction and Y-direction, wherein it also uses the light preventive region (whose transmission factor is 0%) as each of the peripheral regions 2b lying about the hole-pattern 1 in 45-degree and 135-degree oblique directions. Compared with comparison 1 and comparison 2, it is possible to obtain high NILS values by the mask 10 of the present embodiment illuminated with azimuthal polarization light whose pitch ranges between 140 nm to 180 nm.

That is, the present embodiment is characterized in that the overall peripheral area surrounding the hole-pattern 1 is divided into the peripheral regions 2a and the peripheral regions 2b, wherein resolution characteristics are optimized to produce high NILS values by determining whether to apply an inverse phase to incidence light on the peripheral regions 2a and 2b and by individually defining transmission factors with respect to the peripheral regions 2a and 2b. Presumably, the above layout of the peripheral regions 2a and 2b about the hole-pattern 1 may approximately establish Bessel functions with respect to the amplitude distribution of light transmitted through the mask 10 relative to distances from the center of the hole-pattern 1 in the X-direction, Y-direction, 45-degree oblique direction, and 135-degree oblique direction.

In the case of a mask whose pitch is larger than 200 nm, for example, auxiliary patterns (not shown) are arranged at the corners of the hole-pattern 1 so as to approximately achieve imaging of double luminous interference, thus improving NISL values. In other words, the present embodiment may be applied to a prescribed range of pitches which is less than the wavelength of exposure light.

2. Second Embodiment

Figure 4:
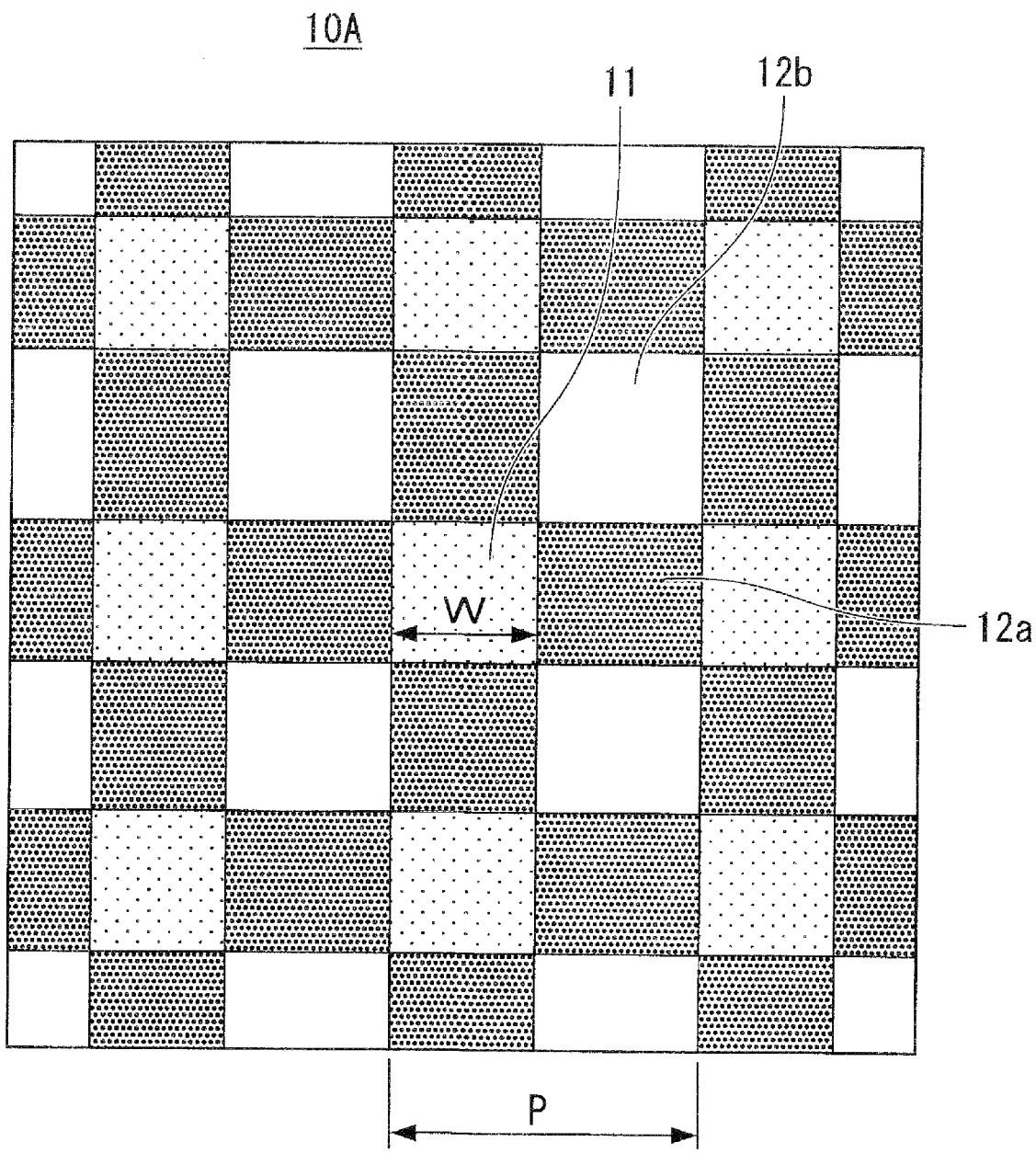
FIG. 4 is a plan view showing an exposure mask in accordance with a second embodiment of the present invention.

FIG. 4 is a plan view showing an exposure mask 10A in accordance with a second embodiment of the present invention, wherein duplicate descriptions regarding parts identical to those of the mask 10 shown in FIG. 1 are omitted or simplified. The mask 10A includes hole-patterns 11 and peripheral regions 12a and 12b. The hole-pattern 11 has a square shape whose scale (W=50 nm) is larger than the limit resolution of exposure light. The hole-patterns 11 are disposed with the prescribed pitch (P=140 nm) therebetween in the X-direction and Y-direction and are composed of halftone phase shift regions for applying an inverse phase to incidence light.

The peripheral region 12a has a rectangular shape (whose long side is 90 nm and whose short side is 50 nm) and is constituted of a light preventive region (whose transmission factor is 0%) disposed between two adjacent hole-patterns 11 lying in the X-direction and in the Y-direction. The peripheral region 12b has a square shape (each side of which is 90 nm) and is constituted of two adjacent hole-patterns 11 lying in the 45-degree oblique direction and in the 135-degree oblique direction. It is preferable that the transmission factor of the peripheral region 12b be greater than 30%, hence, the peripheral region 12b is not always composed of the halftone region but is composed of the transparent region.

Figure 5:
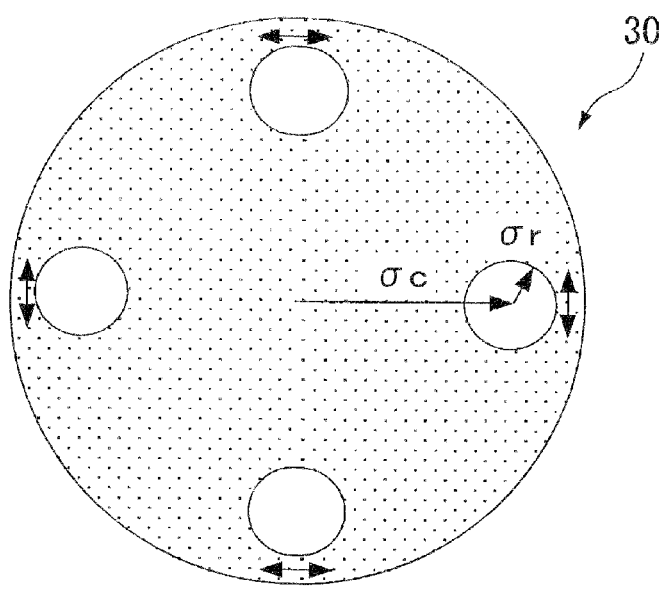
FIG. 5 is a plan view showing a cross-pole illumination for illuminating the exposure mask with linear polarization light.

Next, a pattern forming method will be described in such a way that exposure is performed using the mask 10A so as to form a dot-pattern whose pitch is 140 nm and whose width is 70 nm on the wafer in the X-direction and the Y-direction. Specifically, an ArF exposure device (in which "exposure wavelength $\lambda$"=193 nm, and NA=0.86) whose reduction factor is "4" is used to illuminate the mask 10a with a cross-pole illumination 30 shown in FIG. 5.

The cross-pole illumination 30 is used in the prescribed optical condition in which $\sigma c$=0.8, $\sigma r$=0.1 and X-Y polarization. The cross-pole illumination 30 illuminates the mask 10A with X-Y polarization light whose polarization direction is indicated by arrows in FIG. 5. The X-Y polarization light is produced by two pairs of secondary light sources which are oppositely positioned in the cross-pole illumination 30, wherein one pair of secondary light sources is perpendicular to another pair of secondary light sources in terms of polarization.

Specifically, the cross-pole illumination 30 includes four illuminations and is designed to set the resolving power above the focal depth, wherein it may achieve the least minimum focal depth, but it can form very fine repetitive patterns on the wafer in the X-direction and Y-direction. The cross-pole illumination 30 has an outstanding direction dependency in resolution characteristics, wherein resolution characteristics in the X-direction and Y-direction differ from resolution characteristics in the 45-degree oblique direction and 135-degree oblique direction, for example. Similar to the mask 10, the mask 10A has the pitch P=140 nm. The overall peripheral area about the hole-pattern 11 is divided into the peripheral regions 12a lying in the X-direction and Y-direction and the peripheral regions 12b lying in the 45-degree oblique direction and 135-degree oblique direction, wherein the transmission factors and phases thereof are optimized.

Specifically, the hole-pattern 11 is composed of a halftone phase shift region whose width W is 50 nm, whose transmission factor is 12%, and whose phase difference is 180°. In addition, conditions achieving high NILS values are produced by using transmission factors of the peripheral regions 12a and 12b both having zero-degree phase as parameters.

Figure 6:
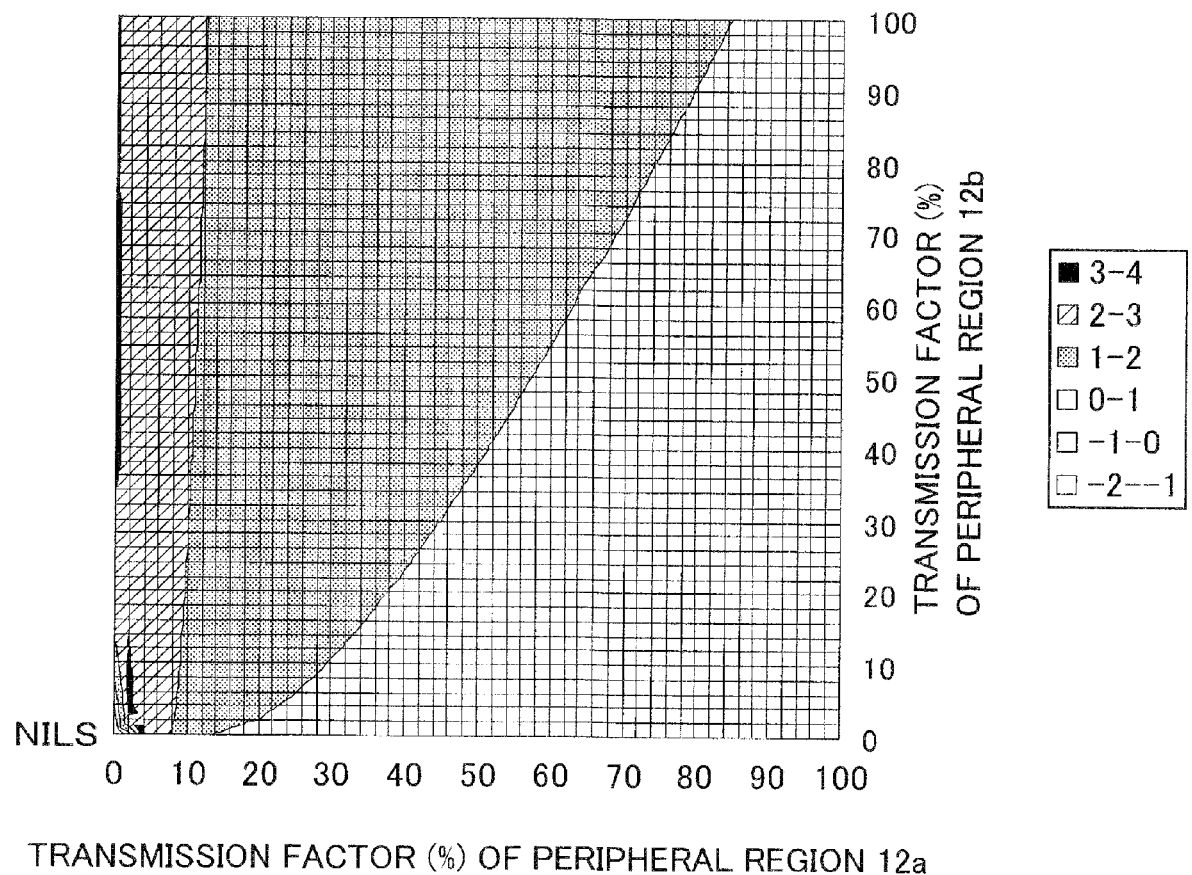
FIG. 6 is a graph showing calculation results of NILS values of a dot-pattern formed by way of exposure using the exposure mask.

FIG. 6 is a graph showing calculation results of NILS values (on the X-axis) with regard to a 70 nm-width dot-pattern which is formed on the wafer and is subjected to exposure using the mask 10A shown in FIG. 4, wherein the horizontal axis represents the transmission factor of the peripheral region 12a, and the vertical axis represents the transmission factor of the peripheral region 12b. In this graph, NILS values of the 70 nm-width dot-pattern are divided in units of "1.0" within the range between "−1.0" to "4.0". This graph shows that NILS values become high when the transmission factor of the peripheral region 12a is 0%.

Figure 7:
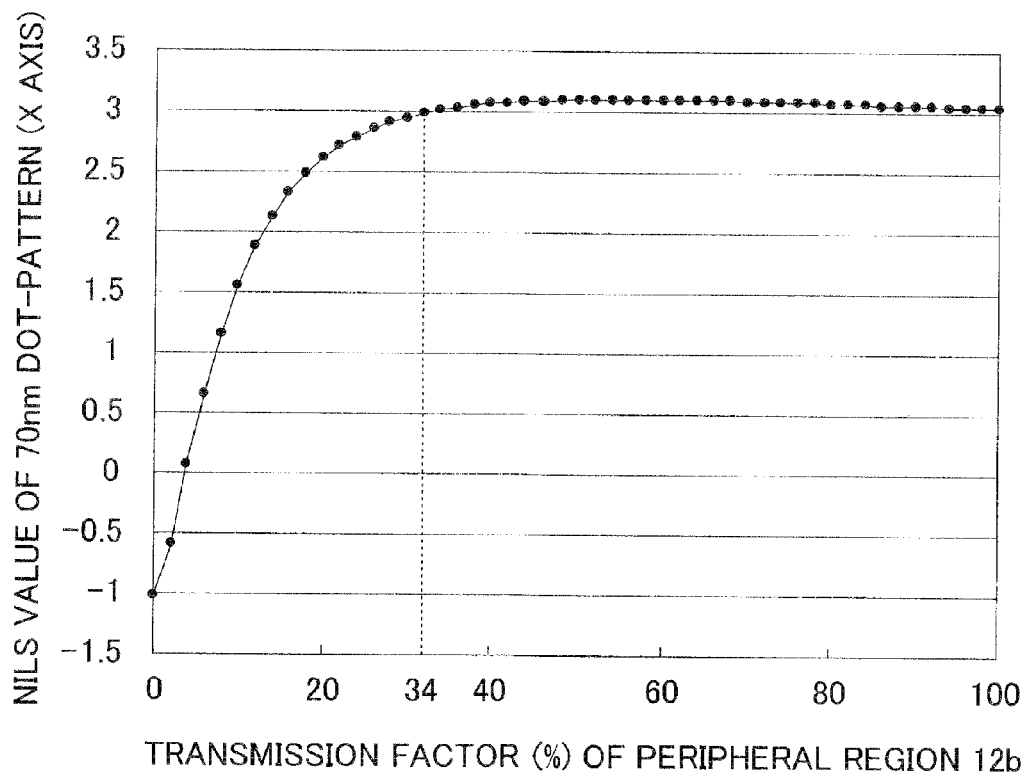
FIG. 7 is a graph showing NILS values extracted from NILS values in FIG. 6 with respect to peripheral regions whose transmission factor is 0% on the X-axis.

A graph of FIG. 7 is produced based on the graph of FIG. 6 so as to indicate NILS values in the case where the transmission factor of the peripheral region 12a is 0%. That is, the graph of FIG. 7 is produced using NILIS values extracted from the graph of FIG. 6 in the case where the transmission factor of the peripheral region 12a is 0% on the vertical axis. FIG. 7 shows that NILS values become higher than 3.0 when the transmission factor of the peripheral region 12a is 0%, and the transmission factor of the peripheral region 12b is higher than 34%. The critical value of the transmission factor of the peripheral region 12b is not necessarily limited to 34%. It is preferable that the transmission factor of the peripheral region 12b be higher than 30% when the scale of the hole-pattern 11 is smaller than the dot-pattern formed on the wafer in correspondence with the hole-pattern 11 and when the transmission factor of the hole-pattern 11 ranges from 2% to 20%.

In consideration of the manufacturing process of the mask 10A, since two types of regions having different transmission factors, i.e. the hole-pattern 11 constituted of the halftone phase shift region and the peripheral region 12b, are formed so as to control phase differences thereof, it is necessary to optimize the condition for forming the halftone mask. The hole-pattern 11 has a phase difference of 180°, while the peripheral region 12b has a phase difference of 0°. To establish the condition for forming the halftone mask, the ArF exposure device may normally require the transmission factor of 6% with regard to the halftone region; however, it is possible to have the transmission factor ranging between 2% to 20%. FIG. 7 shows that substantially the same NILS value is maintained when the transmission factor of the peripheral region 12b is above 30%. This may indicate that when the peripheral region 12b is constituted of a transparent region whose transmission factor is 100%, it is possible to easily produce the mask 10A, which meets the requirements for practical use. The mask 10A of the second embodiment is designed such that the hole-pattern 11 is constituted of the halftone phase shift region, and the peripheral regions 12a and 12b are optimized in terms of transmission factors and phases; but this is not a restriction. It is possible to form the hole-pattern 11 by using the light preventive region and the transparent region, for example.

3. Third Embodiment

Figure 8:
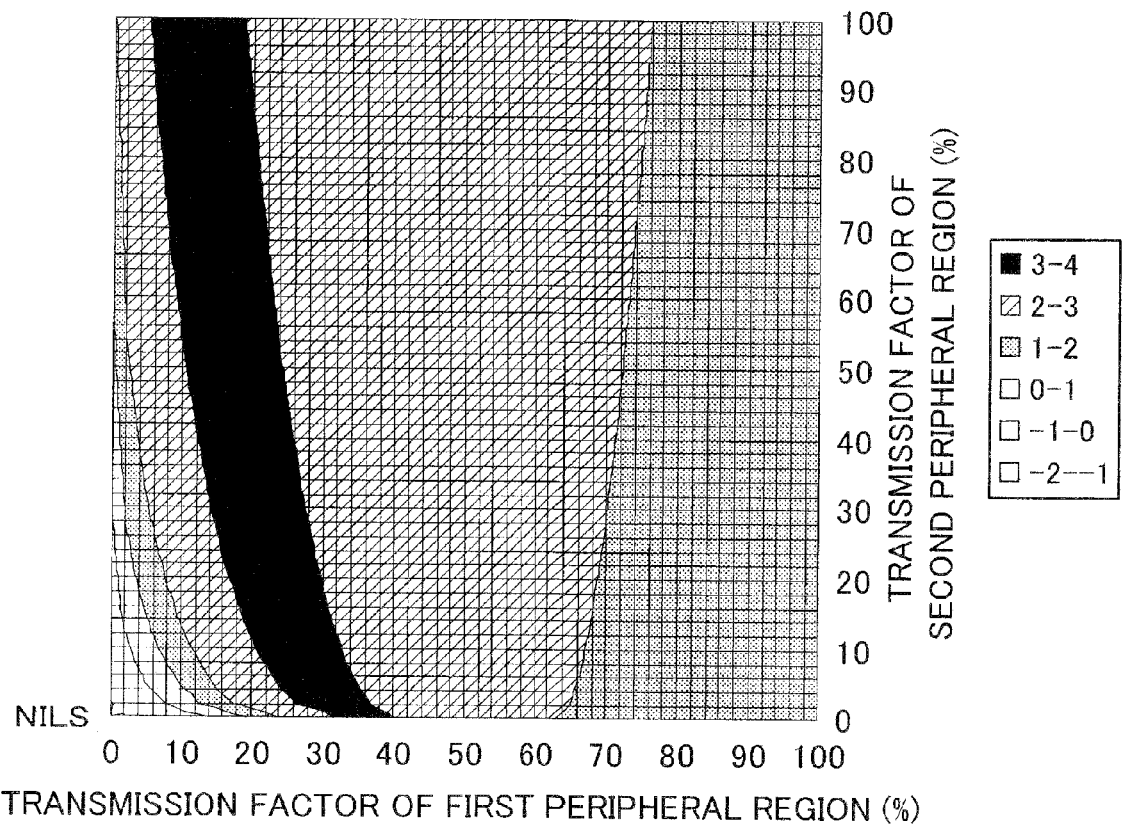
FIG. 8 is a graph showing calculation results of NILS values of a dot-pattern formed by way of exposure using an exposure mask according to a third embodiment of the present invention.

FIG. 8 is a graph showing calculation results of NILS values with respect to a 70 nm-width dot-pattern which is formed on the wafer by use of an exposure mask according to a third embodiment of the present invention. No illustration is provided with respect to the exposure mask of the third embodiment, which includes hole-patterns each constituted of a transparent region whose width W is 50 nm, whose transmission factor is 100%, and whose phase difference is zero degree as well as first and second peripheral regions surrounding hole-patterns. The first peripheral region is constituted of a halftone phase shift region whose transmission factor is 5% and whose phase difference is 180° and is disposed between two adjacent hole-patterns lying in the X-direction and in the Y-direction. The second peripheral region is constituted of a phase shift region whose transmission factor ranges from 0% to 100% and whose phase difference is 180° and is disposed between two adjacent hole-patterns lying in the 45-degree oblique direction and in the 135-degree oblique direction. Similar to the mask 10A, the pitch P of the hole-pattern used in the exposure mask of the third embodiment is set to 140 nm. The exposure mask of the third embodiment is illuminated with linear polarization light emitted from the cross-pole illumination 30 of FIG. 5.

In FIG. 8, the horizontal axis represents the transmission factor of the first peripheral region, while the vertical axis represents the transmission factor of the second peripheral region, wherein NILS values are shown by contour lines. FIG. 8 shows a relatively broad range 40 in which NILS values are above 3.0, wherein the transmission factor of the second peripheral region is varied in the range between 0% and 100% in connection with the transmission factor of the first peripheral region. NILS values reach a highest value of 3.04 when the transmission factor of the first peripheral region is 6%, and the transmission factor of the second peripheral region is 100%.

It is possible to improve resolution characteristics in a relatively broad range by illuminating the mask of the third embodiment with linear polarization light by way of the oblique incidence illumination. Similar to the masks 10 and 10A, it is presumed that Bessel functions are approximately established with respect to the amplitude distribution of light transmitted through the mask of the third embodiment relative to the distances measured from the center of the hole-pattern in the X-Y directions and in the 45/135-degree oblique directions.

The first, second, and third embodiments are not restrictive and thus modified in various ways as follows:

(1) In the mask 10 of the first embodiment, the light preventive film 5 is used to form the peripheral region 2b serving as the light preventive region (see FIG. 2B); but this is not a restriction. It is possible to form the peripheral region 2b using only the halftone film 4, in which a small opening pattern is formed at the center thereof. In this structure, the light transmitted through the small opening pattern differs from the light transmitted through the halftone film 4 with a phase difference of 180°, wherein they cancel out each other so that the peripheral region 2b can be substantially regarded as the light preventive region.

(2) It is preferable that the above opening pattern be smaller than the auxiliary pattern used for establishing imaging of double luminous interference in scale. Specifically, it is possible to form the auxiliary pattern in the periphery of the hole pattern with the pitch P of 200 nm or more, wherein the scale of the auxiliary pattern is reduced to two-thirds of the scale of the hole pattern, i.e. 60 nm, so that the auxiliary pattern can serve as a transparent region. When the above opening pattern is further enlarged in scale so that the pitch between the 45/135-degree oblique directions may exceed the limit resolution of the exposure device, a negative influence occurs such that the focal depth may greatly decrease. For this reason, it is preferable that the scale of the opening pattern be set to 40 nm, which is less than one-half of the hole-pattern.

(3) The aforementioned embodiments are directed to transmission masks adapted to ArF Excima exposure lasers; but this is not a restriction. They can be applied to reflection mask of other wavelengths, e.g. masks in which patterns of optical absorption materials are formed on laminated reflection mirrors.

(4) The aforementioned embodiments are designed such that a plurality of hole-patterns is repetitively aligned in the X-direction and Y-direction with the prescribed pitch P therebetween; but this is not a restriction. For example, two hole-patterns can be positioned close to each other or shifted from each other.

As described above, the present invention can provides various embodiments in terms of exposure masks and pattern forming methods, as follows:

(1) In the exposure mask of the first embodiment, it is preferable that the transmission factor of the semitransparent region 2a range from 2% to 20%, whereby it is possible to improve resolution characteristics by illuminating the exposure mask with linear polarization light by the oblique incidence illumination.

(2) In the mask of the second embodiment, it is preferable that the transmission factor of the peripheral region 12b which is positioned between two rectangular patterns adjacent in a third direction (e.g. 45/135-degree oblique directions), be higher than 30% when the scale (i.e. width W) of the semitransparent region 11 is smaller than the scale of the pattern formed on the wafer in connection with the semitransparent region, and the transmission factor of the semitransparent region ranges from 2% to 20%, wherein it is possible to improve resolution characteristics because the NILS value exceeds 3.0 by illuminating the mask with linear polarization light by the oblique incidence illumination.

(3) In the exposure mask of the third embodiment, it is preferable that the transmission factor of the phase shift region range between 0% and 100% in consideration of the transmission factor of the semitransparent region, wherein it is possible to improve resolution characteristics because the NILS value exceeds 3.0 by illuminating the mask with linear polarization light by the oblique incidence illumination.

(4) In the above, it is preferable that the third direction be inclined to the first and second directions (e.g. the X-direction and the Y-direction) by 45°. In this case, the exposure mask can be applied to manufacturing processes of various types of memories such as DRAM. In addition, it is preferable that the pitch for repetitively aligning rectangular patterns be less than the wavelength of exposure light.

(5) In this connection, it is possible to produce the linear polarization light by the secondary light source forming the zonal illumination 20, and the polarization direction thereof is perpendicular to the radial direction of the secondary light source. In this case, the oblique incidence illumination is replaced with the zonal illumination.

(6) It is possible to produce the linear polarization light by the cross-pole illumination 30 including two pairs of two secondary light sources, wherein the secondary light source is perpendicularly polarized to the counterpart secondary light source. In this case, the oblique incidence illumination is replaced with the cross-pole illumination.

As described heretofore, the exposure mask and pattern forming method according to the present invention are described in conjunction with the above embodiments and variations, which can be further modified in various ways within the scope of the invention.

Lastly, it is apparent that the present invention is not limited to the above embodiments, but may be modified and changed without departing from the scope and spirit of the invention.

What is claimed is:

1. An exposure mask comprising:
    a plurality of rectangular patterns whose scales are higher than a limit resolution of exposure light and which are repetitively aligned in a first direction and a second direction, which are perpendicular to each other;
    a plurality of semitransparent regions, each of which is aligned between two rectangular patterns adjacently lying in either the first direction or the second direction so as to apply an inverse phase to incident light; and a plurality of light preventive regions, each of which is aligned between two rectangular patterns adjacently lying in a third direction which differs from the first direction and the second direction, wherein a pitch between adjacent ones of said plurality of rectangular patterns in the first direction is equal to a sum of widths, in the first direction, of respective adjacent ones of said plurality of rectangular patterns and said plurality of light preventive regions.

2. The exposure mask according to claim 1, wherein the plurality of semitransparent regions each has a transmission factor ranging from 2% to 20%.

3. An exposure mask comprising:
a plurality of rectangular patterns whose scales are higher than a limit resolution of exposure light and which are repetitively aligned in a first direction and a second direction, which are perpendicular to each other, wherein the rectangular patterns are composed of semitransparent regions for applying an inverse phase to incidence light;
a plurality of light preventive regions, each of which is aligned between two rectangular patterns adjacently lying in either the first direction or the second direction; and
a plurality of transparent regions, each of which is aligned between two rectangular patterns adjacently lying in a third direction which differs from the first direction and the second direction,
wherein a pitch between adjacent ones of said plurality of rectangular patterns in the first direction is equal to a sum of widths, in the first direction, of respective adjacent ones of said plurality of rectangular patterns and said plurality of transparent regions.

4. The exposure mask according to claim 3, wherein the scale of each of the semitransparent regions is smaller than the scale of a pattern actually formed on a wafer in correspondence with the semitransparent regions, and wherein each of the plurality of transparent regions aligned between the two rectangular patterns adjacently lying in the third direction has a transmission factor of 30% or more when the transmission factor of the semitransparent regions ranges from 2% to 20%.

5. The exposure mask according to claim 1, wherein the third direction is inclined to the first direction and the second direction by 45°.

6. The exposure mask according to claim 3, wherein the third direction is inclined to the first direction and the second direction by 45°.

7. The exposure mask according to claim 1, wherein the pitch is less than a wavelength of the exposure light.

8. The exposure mask according to claim 3, wherein the pitch is less than a wavelength of the exposure light.

9. A pattern forming method for forming a pattern on a wafer by use of an exposure mask comprising:
a plurality of rectangular patterns whose scales are higher than a limit resolution of exposure light and which are repetitively aligned in a first direction and a second direction, which are perpendicular to each other;
a plurality of semitransparent regions, each of which is aligned between two rectangular patterns adjacently lying in either the first direction or the second direction so as to apply an inverse phase to incident light; and
a plurality of light preventive regions, each of which is aligned between two rectangular patterns adjacently lying in a third direction which differs from the first direction and the second direction,
wherein a pitch between adjacent ones of said plurality of rectangular patterns in the first direction is equal to a sum of widths, in the first direction, of respective adjacent ones of said plurality of rectangular patterns and said plurality of light preventive regions, and
wherein the exposure mask is illuminated with linear polarization light by an oblique incident illumination.

10. A pattern forming method for forming a pattern on a wafer by use of an exposure mask comprising:
a plurality of rectangular patterns whose scales are higher than a limit resolution of exposure light and which are repetitively aligned in a first direction and a second direction, which are perpendicular to each other, wherein the rectangular patterns are composed of semitransparent regions for applying an inverse phase to incidence light;
a plurality of light preventive regions, each of which is aligned between two rectangular patterns adjacently lying in either the first direction or the second direction; and
a plurality of transparent regions, each of which is aligned between two rectangular patterns adjacently lying in a third direction which differs from the first direction and the second direction,
wherein a pitch between adjacent ones of said plurality of rectangular patterns in the first direction is equal to a sum of widths, in the first direction, of respective adjacent ones of said plurality of rectangular patterns and said plurality of transparent regions, and
wherein the exposure mask is illuminated with linear polarization light by an oblique incident illumination.

11. The pattern forming method according to claim 9, wherein the linear polarization light is produced by a secondary light source forming a zonal illumination so that a polarization direction thereof is perpendicular to a radial direction of the secondary light source.

12. The pattern forming method according to claim 10, wherein the linear polarization light is produced by a secondary light source forming a zonal illumination so that a polarization direction thereof is perpendicular to a radial direction of the secondary light source.

13. The pattern forming method according to claim 9, wherein the linear polarization light is produced by a cross-pole illumination constituted of two pairs of two secondary light sources positioned opposite to each other so that a polarization direction thereof is perpendicular to a direction for oppositely aligning the two secondary light sources.

14. The pattern forming method according to claim 10, wherein the linear polarization light is produced by a cross-pole illumination constituted of two pairs of two secondary light sources positioned opposite to each other so that a polarization direction thereof is perpendicular to a direction for oppositely aligning the two secondary light sources.

* * * * *